(12) United States Patent
Lee

(10) Patent No.: US 10,617,005 B2
(45) Date of Patent: Apr. 7, 2020

(54) DISPLAY DEVICE

(71) Applicant: Samsung Display Co., Ltd., Yongin-si (KR)

(72) Inventor: Young Hoon Lee, Changwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/671,819

(22) Filed: Aug. 8, 2017

(65) Prior Publication Data

US 2018/0110122 A1  Apr. 19, 2018

(30) Foreign Application Priority Data

Oct. 13, 2016 (KR) .................. 10-2016-0132976

(51) Int. Cl.
*H05K 1/14* (2006.01)
*H01L 27/32* (2006.01)
(Continued)

(52) U.S. Cl.
CPC ........... *H05K 1/14* (2013.01); *H01L 27/3276* (2013.01); *H05K 1/113* (2013.01); *H05K 1/118* (2013.01); *H05K 1/147* (2013.01); *H05K 1/189* (2013.01); *H05K 3/365* (2013.01); *H01L 27/124* (2013.01); *H01L 51/0097* (2013.01); *H01L 51/52* (2013.01); *H01L 2251/5338* (2013.01); *H05K 1/028* (2013.01); *H05K 3/363* (2013.01); *H05K 2201/09409* (2013.01); *H05K 2201/09481* (2013.01); *H05K 2201/09709* (2013.01)

(58) Field of Classification Search
CPC .......... H05K 1/113; H05K 1/115; H05K 1/14; H05K 1/189; H05K 1/028; H05K 1/118; H05K 1/147; H05K 3/363; H05K 3/365; H05K 2201/09409; H05K 2201/09481; H05K 2201/09709; G02F 1/1345; G02F 1/13452; H01L 27/3276; H01L 27/124; H01L 51/0097; H01L 51/52

See application file for complete search history.

(56) References Cited

U.S. PATENT DOCUMENTS 8,063,497 B2 * 11/2011 Tang ....................... H01L 24/17
257/692
2002/0014346 A1 * 2/2002 Tsunemasu ........ H01L 23/49816
174/535

(Continued)

FOREIGN PATENT DOCUMENTS

JP         2003255850    9/2003
KR      1020040005746    1/2004
KR      1020080059836    7/2008

*Primary Examiner* — Roshn K Varghese
(74) *Attorney, Agent, or Firm* — Cantor Colburn LLP

(57) ABSTRACT

A display device includes: a substrate including a display area positioned on a first surface and displaying an image and a peripheral area positioned around the display area; a first pad portion disposed on a second surface of the substrate as a surface opposite to the first surface of the substrate; a plurality of through-holes disposed on the peripheral area and penetrating the substrate; a plurality of connection wires disposed on the peripheral area and connecting the display area and the first pad portion through the plurality of through-holes; and a printed circuit board including a second pad portion coupled with the first pad portion.

17 Claims, 18 Drawing Sheets

(51) Int. Cl.
*H05K 1/11* (2006.01)
*H05K 3/36* (2006.01)
*H05K 1/18* (2006.01)
H01L 51/52 (2006.01)
H01L 27/12 (2006.01)
H01L 51/00 (2006.01)
H05K 1/02 (2006.01)

(56) References Cited

U.S. PATENT DOCUMENTS

| | | | |
|---|---|---|---|
| 2005/0127493 A1* | 6/2005 | Yuzawa | H01L 23/49838 |
| | | | 257/692 |
| 2006/0043570 A1* | 3/2006 | Muramatsu | H01L 21/486 |
| | | | 257/698 |
| 2007/0029658 A1* | 2/2007 | Peng | G02F 1/13452 |
| | | | 257/680 |
| 2013/0321251 A1* | 12/2013 | Kang | G09G 3/36 |
| | | | 345/87 |
| 2014/0184057 A1* | 7/2014 | Kim | G06F 1/1637 |
| | | | 313/504 |
| 2014/0225215 A1 | 8/2014 | Chien et al. | |
| 2014/0300849 A1* | 10/2014 | Jung | H01L 27/3276 |
| | | | 349/139 |
| 2015/0028363 A1* | 1/2015 | Lee | H01L 23/481 |
| | | | 257/88 |

* cited by examiner

DISPLAY DEVICE

This application claims priority to Korean Patent Application No. 10-2016-0132976, filed on Oct. 13, 2016, and all the benefits accruing therefrom under 35 U.S.C. § 119, the content of which in its entirety is herein incorporated by reference.

BACKGROUND (1) Field

The disclosure relates to a display device.

(2) Description of the Related Art

Currently, display devices, such as a liquid crystal display ("LCD"), a plasma display panel ("PDP"), an organic light emitting diode ("OLED") display, a field effect display ("FED"), an electrophoretic display and the like, are widely used in many fields.

Among the display devices, the OLED display typically includes two electrodes and an organic emission layer interposed therebetween. In the OLED display, electrons injected from one electrode and holes injected from the other electrode are combined in the organic emission layer to generate excitons, and the generated excitons release energy to emit light.

The OLED display may have thin thickness and light weight since the OLED display has a self-luminance characteristic and operates without using an additional light source, unlike the LCD. In addition, the OLED display is receiving attention as a next generation display device since the OLED has various desired characteristics such as low power consumption, high luminance, and high response speed.

In the OLED display, a printed circuit board may be bonded at a peripheral area of the substrate and signals used for the driving are transmitted through the printed circuit board to drive the organic light emitting element of the OLED display.

SUMMARY

An organic light emitting diode ("OLED") display may have a structure in which a part of the printed circuit board attached to the substrate is bent is widely used, and in such an OLED display, a crack may be generated in metal wires positioned on the bent printed circuit board. In such an OLED display, a size of a bezel of the display device may be increased by the bent printed circuit board.

Exemplary embodiments of the invention relate to a display device in which a crack in metal wires of the printed circuit board is effectively prevented from being generated.

Exemplary embodiments of the invention relate to a display device with reduced dead space.

An exemplary embodiment a display device includes: a substrate including a display area defined on a first surface thereof and which displays an image and a peripheral area defined around the display area, where a plurality of through-holes is defined through the substrate in the peripheral area; a first pad portion disposed on a second surface of the substrate, which is opposite to the first surface of the substrate; a plurality of connection wires disposed on the peripheral area, where the plurality of connection wires connects the display area and the first pad portion through the plurality of through-holes; and a printed circuit board including a second pad portion connected to the first pad portion.

In an exemplary embodiment, the first pad portion may include a plurality of first pad terminals overlapping the plurality of through-holes.

In an exemplary embodiment, the plurality of through-holes may be linearly arranged in a first direction.

In an exemplary embodiment, the plurality of connection wires may extend in a second direction crossing the first direction.

In an exemplary embodiment, each of the plurality of connection wires may be bent at least once.

In an exemplary embodiment, the plurality of through-holes may include a plurality of first row through-holes arranged linearly along a first row, which is parallel to the first direction, and a plurality of second row through-holes linearly arranged along a second row, which is parallel to the first row, where the first row and the second row may be spaced apart from each other in a second direction crossing the first direction.

In an exemplary embodiment, the plurality of first pad terminals may include a plurality of first connection pad terminals linearly arranged along the first row and overlapping the plurality of first row through-holes, respectively, and a plurality of second connection pad terminals linearly arranged along the second row and overlapping the plurality of second row through-holes, respectively.

In an exemplary embodiment, the plurality of through-holes may include a plurality of third row through-holes linearly arranged along a third row, where the third row may form a first inclination angle with the first direction, and a plurality of fourth row through-holes linearly arranged along a fourth row, where the fourth row may form a second inclination angle with the first direction.

In an exemplary embodiment, the plurality of first pad terminals may include a plurality of third connection pad terminals linearly arranged along the third row and overlapping the plurality of third row through-holes, respectively, and a plurality of fourth connection pad terminals linearly arranged along the fourth row and overlapping the plurality of fourth row through-holes, respectively.

In an exemplary embodiment, the first inclination angle and the second inclination angle may be equal to each other.

In an exemplary embodiment, the first inclination angle and the second inclination angle may be in a range of about zero (0) degree to about 90 degrees.

In an exemplary embodiment, the second pad portion may include a plurality of second pad terminals disposed in an arrangement corresponding to an arrangement of the plurality of first pad terminals.

In an exemplary embodiment, the printed circuit board may include a base film on which a second pad portion is disposed in a side thereof, and a driving chip disposed on the base film in an opposing side thereof.

In an exemplary embodiment, the base film may be flexible.

In an exemplary embodiment, each of the plurality of first pad terminals may have a quadrangular plate-like shape.

In an exemplary embodiment, the substrate may be flexible.

In an exemplary embodiment, the display device may further include a plurality of data lines in the display area on the substrate and a plurality of gate lines in the display area on the substrate and crossing the plurality of data lines.

In an exemplary embodiment, the plurality of connection wires may be disposed in a same layer as one of the plurality of data lines and the plurality of gate lines.

In an exemplary embodiment, each of the plurality of gate line may have a dual-layer structure including a first gate member and a second gate member disposed on the first gate member, and the plurality of connection wires may be disposed in a same layer as one of the first gate member and the second gate member.

In an exemplary embodiment, the first pad portion and the second pad portion may face each other.

According to exemplary embodiments of the display device, a crack of the metal wires positioned on the printed circuit board may be effectively prevented.

In such embodiments, a dead space of the display device, which is typically occupied with a bent region of the printed circuit board, may be reduced.

BRIEF DESCRIPTION OF THE DRAWINGS

These and/or other features of the invention will become apparent and more readily appreciated from the following detailed description of embodiments thereof, taken in conjunction with the accompanying drawings, in which.

DETAILED DESCRIPTION

Figure 1A:
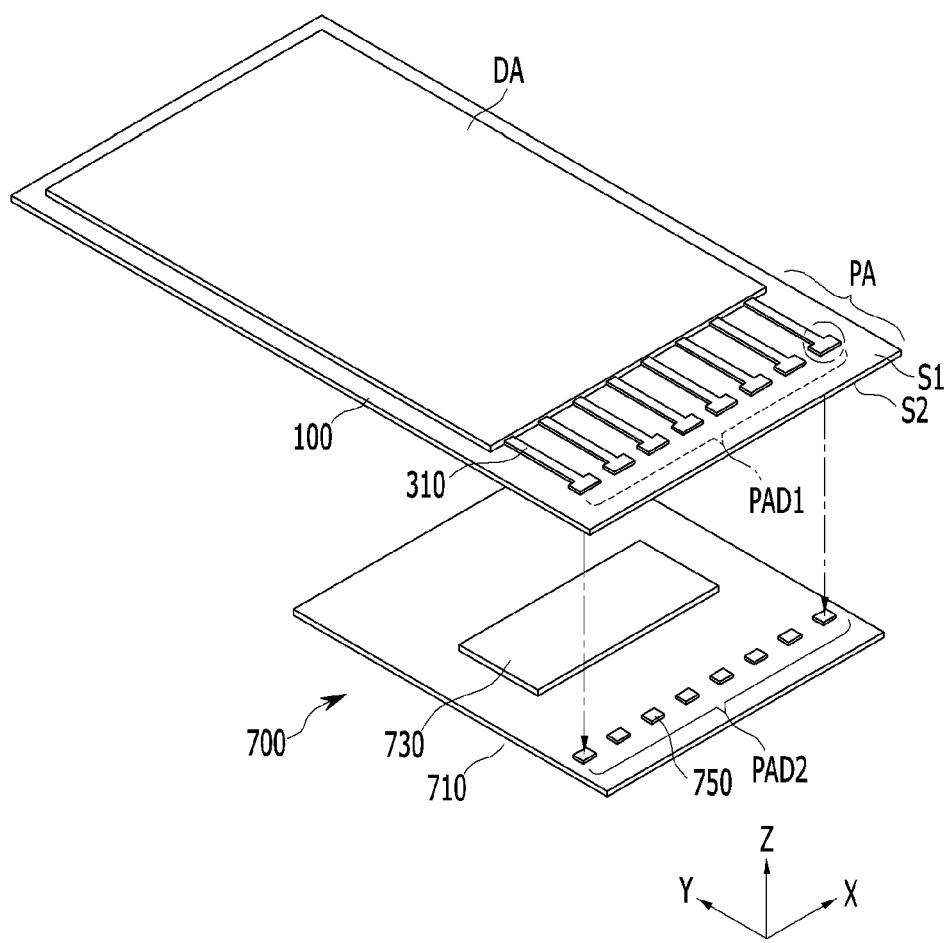
FIG. 1A is a schematic exploded perspective view of a display device according to an exemplary embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one elements relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of a display device according to the invention will be described in detail with reference to the accompanying drawings.

Figure 1B:
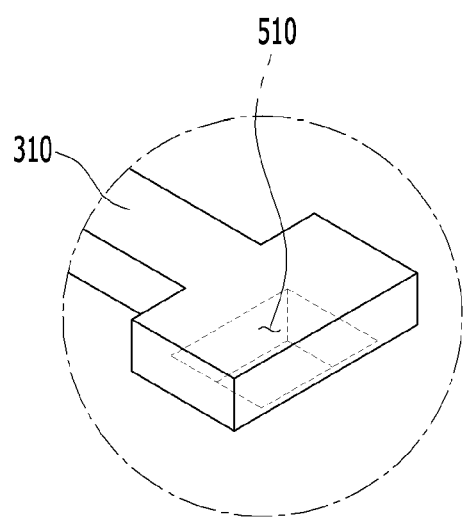
FIG. 1B is an enlarged view of the encircled portion in FIG. 1A.
Figure 2:
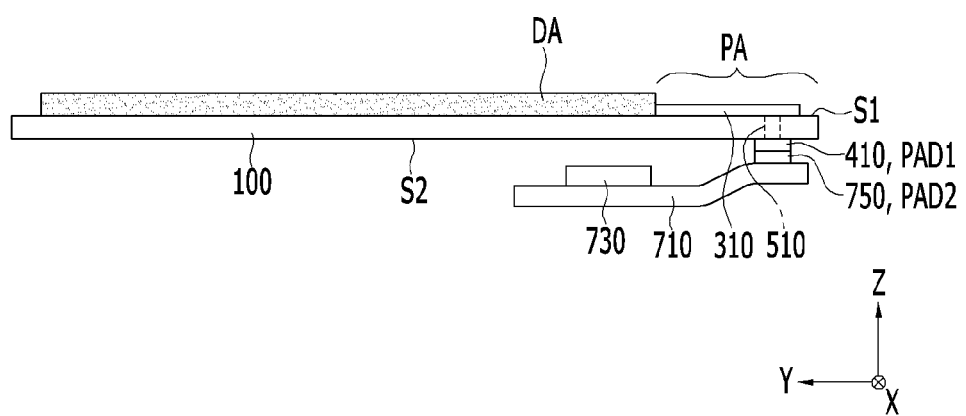
FIG. 2 is a schematic side view of a display device according to an exemplary embodiment of the invention.

FIG. 1A is a schematic exploded perspective view of a display device according to an exemplary embodiment of the invention, FIG. 1B is an enlarged view of the encircled portion in FIG. 1A, and FIG. 2 is a schematic side view of a display device according to an exemplary embodiment of the invention.

Referring to FIG. 1 and FIG. 2, an exemplary embodiment of the display device may include a substrate 100, a first pad portion PAD1, a second pad portion PAD2 and the printed circuit board 700. The first pad portion PAD1 on a second surface S2 (e.g., a lower surface) of the substrate 100 may be in contact with the second pad portion PAD2 of the printed circuit board 700. In such an embodiment, a plurality of connection wires 310, which is disposed on a first surface S1 (e.g., an upper surface) of the substrate 100 and connected to the display area DA, may be electrically connected to the first pad portion PAD1 through a plurality of through-holes 510 defined in the peripheral area PA of the substrate 100. The bonding structure of the first pad portion PAD1 and the second pad portion PAD2 in an exemplary embodiment of the display device will be described later in greater detail.

In an exemplary embodiment, where the second pad portion PAD2 of the printed circuit board 700 is in direct contact with the first pad portion PAD1 on the second surface S2 or the bottom surface of the substrate 100, a structure for connecting the substrate 100 and the printed circuit board 700 may be effectively provided without using a bent portion.

In such an embodiment, the display device may include the display area DA and the peripheral area PA. The display area DA and the peripheral area PA may be defined on the substrate 100. In such an embodiment, the substrate 100 may be flexible.

The display area DA is a region for displaying an image, and a display panel PNL (referring to FIG. 4) that displays the image may be positioned in the display area DA, that is, a plurality of deposition structures may be positioned therein. The display panel PNL disposed on the display area DA will be described later in greater detail.

The peripheral area PA is a region around the display area DA, and the printed circuit board 700 for transmitting signals from an outside or an external system may be connected to the peripheral area PA. In such an embodiment, the plurality of connection wires 310 and the first pad portion PAD1 are disposed in the peripheral area PA, and the first pad portion PAD1 may be connected to or bonded with the second pad portion PAD2 of the printed circuit board 700.

The plurality of connection wires 310 is disposed in the peripheral area PA, and the display area DA and the first pad portion PAD1 may be connected by the plurality of connection wires 310. In such an embodiment, the plurality of connection wires 310 may be connected to the plurality of signal lines disposed in the display area DA.

In an exemplary embodiment, the plurality of connection wires 310 may be connected to the first pad portion PAD1 through the plurality of through-holes 510 defined on the peripheral area PA through the substrate 100. In such an embodiment, the plurality of connection wires 310 may be electrically connected to the first pad portion PAD1 on the second surface S2 of the lower surface of the substrate 100 through the plurality of through-holes 510.

The first pad portion PAD1 may include a plurality of first pad terminals 410 (referring to FIG. 8) disposed on the second surface S2 of the substrate 100. The plurality of first pad terminals 410 (referring to FIG. 8) may be in direct contact with a plurality of second pad terminals 750 of the second pad portion PAD2. In such an embodiment, the plurality of first pad terminals 410 (referring to FIG. 8) may be connected to the plurality of connection wires 310 through the plurality of through-holes 510.

In an exemplary embodiment, the signal to be transmitted from the printed circuit board 700 may be sequentially transmitted to the first pad portion PAD1, the connection wires 310 and the display area DA. The structure of the first pad terminal 410 (referring to FIG. 8), the connection wires 310, and the through-hole 510 will be described later in greater detail.

The printed circuit board 700 is connected to the first pad portion PAD1 of the peripheral area PA of the substrate 100, thereby transmitting the signal used for driving the display panel PNL (referring to FIGS. 2-4) to the display panel PNL. In an exemplary embodiment, a driving chip 730 may be disposed or mounted on a flexible base film 710 of the printed circuit board 700, and the driving chip 730 may be used to drive the display panel PNL. FIG. 1 and FIG. 2 show an exemplary embodiment in which the driving chip 730 is disposed on an upper surface of the base film 710 to face the second surface S2 of the substrate 100.

Figure 3:
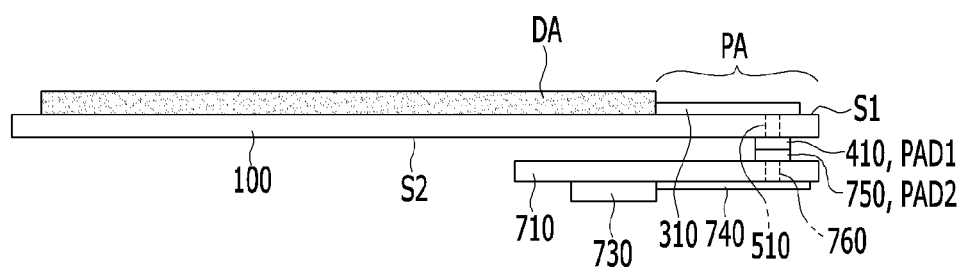
FIG. 3 is a view showing an exemplary embodiment of a printed circuit board of FIG. 2.

However, in an alternative exemplary embodiment, as shown in FIG. 3, the driving chip 730 may be disposed on a lower surface of the base film 710. In such an embodiment, terminal wires 740 connected to the driving chip 730 are disposed at the lower surface of the base film 710, and a connection hole 760 may be defined through the base film 710. In such an embodiment, the terminal wires 740 may be connected to the second pad terminal 750 through the connection hole 760. In such an embodiment, the driving chip 730 may be electrically connected to the second pad terminal 750 through the terminal wires 740.

In an exemplary embodiment, the second pad portion PAD2 is disposed at an end portion of the base film 710, and the second pad portion PAD2 may be coupled to the first pad portion PAD1 of the substrate 100. The second pad portion PAD2 is in direct contact with the first pad portion PAD1 such that the signal of the driving chip 730 may be transmitted to the first pad portion PAD1 of the substrate 100. In an exemplary embodiment, the printed circuit board 700 is disposed on or attached to the second surface S2 of the substrate 100, not the first surface S1 of the substrate 100. In one exemplary embodiment, for example, the printed circuit board 700 is not attached to the upper surface of the substrate 100 on which the display panel PNL (referring to FIGS. 2-4), but is attached to the lower surface of the substrate 100.

If the printed circuit board 700 is attached to the first surface S1, a remaining portion of the printed circuit board 700 except for the portion thereof attached to the substrate 100 may be bent to be positioned to face the second surface S2 or the lower surface of the substrate 100 to reduce a non-display area or bezel size of the display device. However, according to an exemplary embodiment, the printed circuit board 700 is attached to the second surface S2 or the lower surface, not the first surface S1, such that a dead space that may exist due to the bent portion of the printed circuit board 700 in the display device may be reduced, and the manufacturing cost of the printed circuit board 700 is thereby reduced. Such features will be described later in greater detail with reference to FIG. 11.

In an exemplary embodiment, the second pad portion PAD2 is disposed to face the first pad portion PAD1, and the second pad portion PAD2 may include a plurality of second pad terminals 750. The plurality of second pad terminals 750 may be disposed in a shape corresponding to a plurality of first pad terminals 410 (referring to FIG. 8) of the first pad portion PAD1. The plurality of first pad terminals 410 (referring to FIG. 8) of the first pad portion PAD1 and the plurality of second pad terminals 750 of the second pad portion PAD2 may have a shape corresponding to each other, and the plurality of first pad terminals 410 and the plurality of second pad terminals 750 may be in contact with each other in a one-to-one correspondence.

Hereinafter, the display panel PNL in the display area DA will be described in detail with reference to FIG. 4 and FIG. 5.

Figure 4:
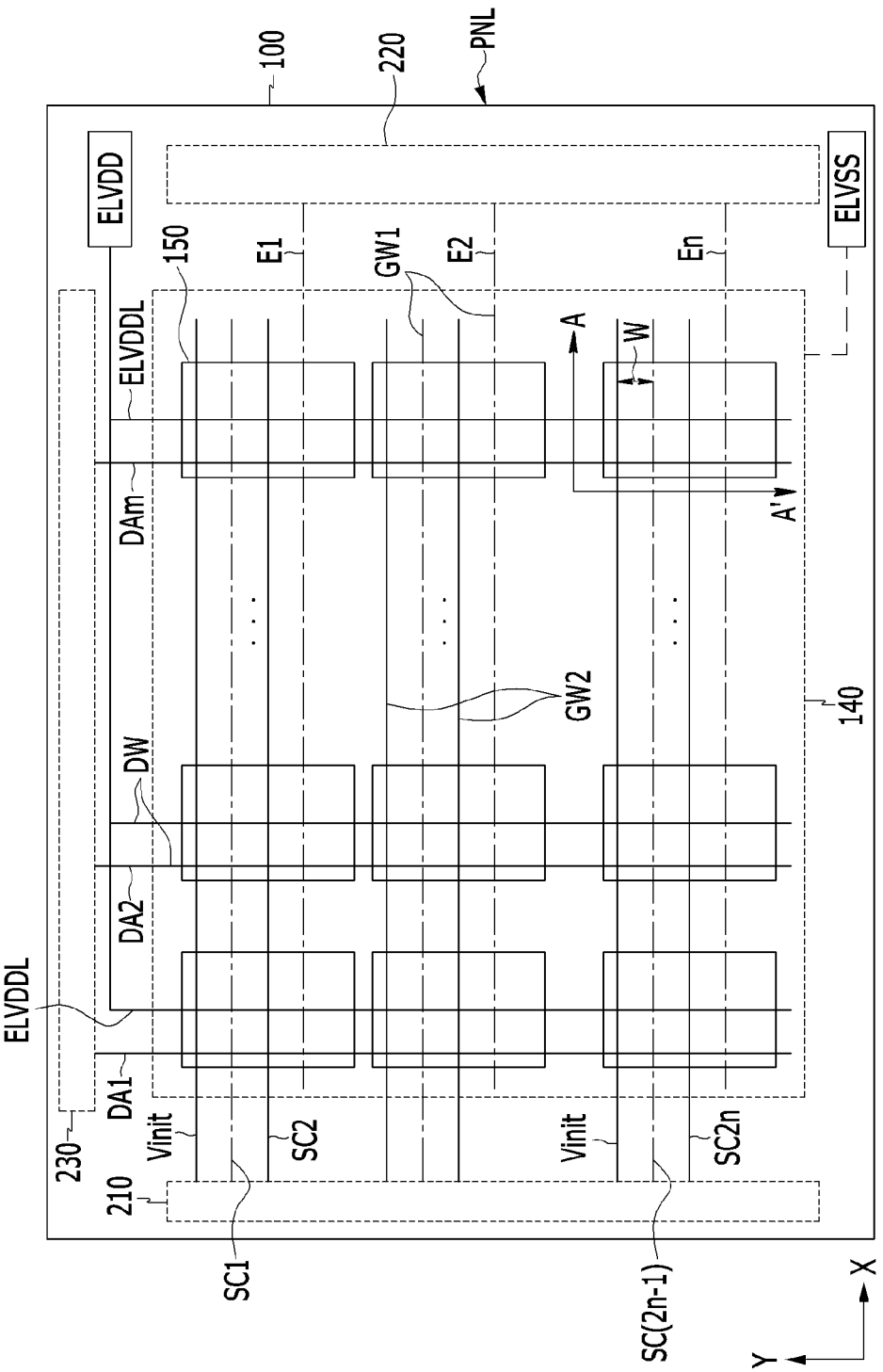
FIG. 4 is a view schematically showing a display area of FIG. 1.
Figure 5:
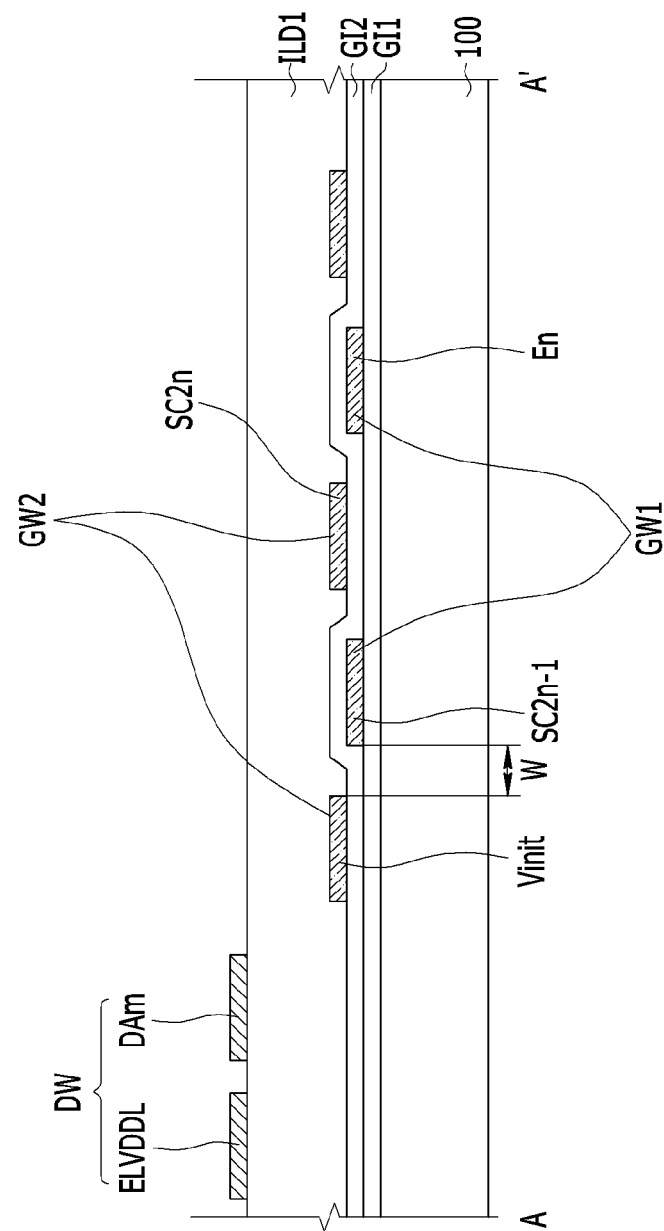
FIG. 5 is a cross-sectional view taken along line A-A of FIG. 4.

FIG. 4 is a view schematically showing a display area of FIG. 1, and FIG. 5 is a cross-sectional view taken along line A-A of FIG. 4.

According to an exemplary embodiment, the display panel PNL includes first gate wires GW1, second gate wires GW2, data wires DW, a display unit 140, and a pixel 150. Referring to FIG. 4 and FIG. 5, gate wires includes first gate wires GW1 and second gate wires GW2 that are positioned at different layers from each other, however it is not limited thereto. Alternatively, the gate wires may all be disposed in a same single layer.

A gate driver 210 sequentially supplies a scan signal to first scan lines SC2-SC2$n$ or second scan lines SC1-SC2$n$-1 defined by the first gate wires GW1 or the second gate wires GW2 in response to a control signal supplied from an external control circuit (not shown), for example, a timing controller. Here, n is a natural number of greater than 1.

The pixel 150 is selected by a scan signal to be sequentially supplied with a data signal. In an exemplary embodiment, the gate driver 210 shown in FIG. 4 may be disposed in a driving chip 730 (referring to FIG. 1) on a printed circuit board 700 (referring to FIG. 1), although it is shown in the display panel PNL in FIG. 4 for convenience of illustration and description.

In an exemplary embodiment, as shown in FIG. 5, the display panel PNL includes a substrate SUB, and a first insulating layer GI1 disposed on the substrate SUB. The first gate wires GW1 are positioned on the substrate SUB via the first insulating layer GI1 and extend in a first direction. The first gate wires GW1 includes a second scan line SC(2$n$-1) and light emission lines E1-E$n$.

The second scan line SC(2$n$-1) is connected to the gate driver 210 and receives the scan signal from the gate driver 210. The light emission lines E1-E$n$ are connected to a light emission driver 220, and receive a light emission control signal from the light emission driver 220. In an exemplary embodiment, the light emission driver 220 shown in FIG. 4 may be disposed in the driving chip 730 (referring to FIG. 1) on the printed circuit board 700 (referring to FIG. 1), although it is shown in the display panel PNL in FIG. 4 for convenience of illustration and description.

In such an embodiment, a second insulating layer GI2 is disposed on the first gate wires GW1. The second gate wires GW2 are positioned on the first gate wires GW1 via the second insulating layer GI2 and extend in the first direction. The second gate wires GW2 include a first scan line SC2$n$ and an initialization power line Vinit.

In an exemplary embodiment, as shown in FIGS. 4 and 5, the first gate wires GW1 and the second gate wires GW2 do not overlap each other when viewed from a top plan view or a plan view in a thickness direction of the display panel PNL.

The first scan line SC2$n$ is connected to the gate driver 210 and receives the scan signal from the gate driver 210. The initialization power line Vinit is connected to the gate driver 210 and receives initialization power from the gate driver 210.

In an exemplary embodiment of the invention, the initialization power line Vinit receives the initialization power from the gate driver 210, but not being limited thereto. Alternatively, the initialization power line Vinit may be connected to an additional element and may receive the initialization power from the additional element.

The light emission driver 220 sequentially supplies the light emission control signals to the light emission lines E1-E$n$ in response to a control signal supplied from the outside such as the timing controller. Thus, the light emission of the pixel 150 is controlled by the light emission control signal.

In such an embodiment, the light emission control signal controls a light emission time of the pixel 150. Alternatively, the light emission driver 220 may be omitted depending on an inner structure of the pixel 150.

A data driver 230 supplies a data signal to a data line DA$m$ among the data wires DW in response to the control signal supplied from the outside such as the timing controller. The data signal supplied to the data line DA$m$ is supplied to the pixel 150 selected from the scan signal whenever the scan signal is supplied to the first scan line SC2$n$ or the second scan line SC(2$n$-1). Then, the pixel 150 is charged with a voltage corresponding to the data signal and emits light with corresponding luminance. In an exemplary embodiment, the data driver 230 may be disposed in the driving chip 730 (referring to FIG. 1) on the printed circuit board 700 (referring to FIG. 1), and it is conceptually shown in the display panel PNL in FIG. 44 for convenience of illustration and description. In such an embodiment, the position of the data driver 230 connected to the data line DA$m$ is not limited to the position shown in FIG. 4.

The data wires DW are positioned on the second gate wires GW2 via a third insulating layer ILD1 disposed thereon, and extend in a second direction crossing the first direction. The data wires DW include data lines DA1-DA$m$ and a driving power source line ELVDDL. The data line DA$m$ is connected to the data driver 230 and receives the data signal from the data driver 230. The driving power source line ELVDDL connected to an external first power source ELVDD that will be described later, and receives driving power from the first power source ELVDD.

In an exemplary embodiment, the driving power source line ELVDDL and the data line DA$m$ may be in a same layer on the third insulating layer ILD1. However, the invention is not limited thereto, and the driving power source line ELVDDL and the data line DAm may be in different layers from each other.

In one exemplary embodiment, for example, the driving power source line ELVDDL may be disposed in a same layer as the first gate wires GW1 and the data line DAm may be disposed in a same layer as the second gate wires GW2. In one alternative exemplary embodiment, for example, the driving power source line ELVDDL may be disposed in a same layer as the second gate wires GW2 and the data line DAm may be disposed in a same layer as the first gate wires GW1.

The display unit 140 includes the plurality of pixels 150 positioned on the crossing regions of the first gate wires GW1, the second gate wires GW2, and the data wires DW. Here, each pixel 150 includes an organic light emitting element that emits a light with luminance corresponding to a driving current corresponding to the data signal, and a pixel circuit to control the driving current flowing to the organic light emitting element.

The pixel circuit is respectively connected to the first gate wires GW1, the second gate wires GW2 and the data wires DW, and the organic light emitting element is connected to the pixel circuit. In such an embodiment, as described above, each pixel 150 includes an organic light emitting element, but not being limited thereto.

The organic light emitting element of the display unit 140 is connected to the external first power source ELVDD via the pixel circuit interposed therebetween, and is also connected to a second power source ELVSS. The first power source ELVDD and the second power source ELVSS respectively supply the driving power and the common power to the pixel 150 of the display unit 140, and the pixel 150 emits light with the luminance corresponding to the driving current from the first power source ELVDD through the organic light emitting element in response to the data signal depending on the driving power and the common power supplied to the pixel 150.

In an exemplary embodiment of the display device, as described above, the first gate wires GW1 and the second gate wires GW2 as the gate wires extend along the pixels 150 in the first direction, and the first gate wires GW1 and the second gate wires GW2 are respectively positioned at different layers from each other via the second insulating layer GI2. Accordingly, in such an embodiment, a distance W on a plane between the gate wires that are positioned at the different layers and are adjacent to each other may be decreased, thereby increasing density of pixels 150 in a predetermined area. Accordingly, in such an embodiment, a high resolution display device may be effectively provided.

Next, the structure of the plurality of connection wires 310, the plurality of through-holes 510, and the first pad portion PAD1 disposed in the peripheral area PA will be described in detail with reference to FIG. 6 to FIG. 10.

Figure 6:
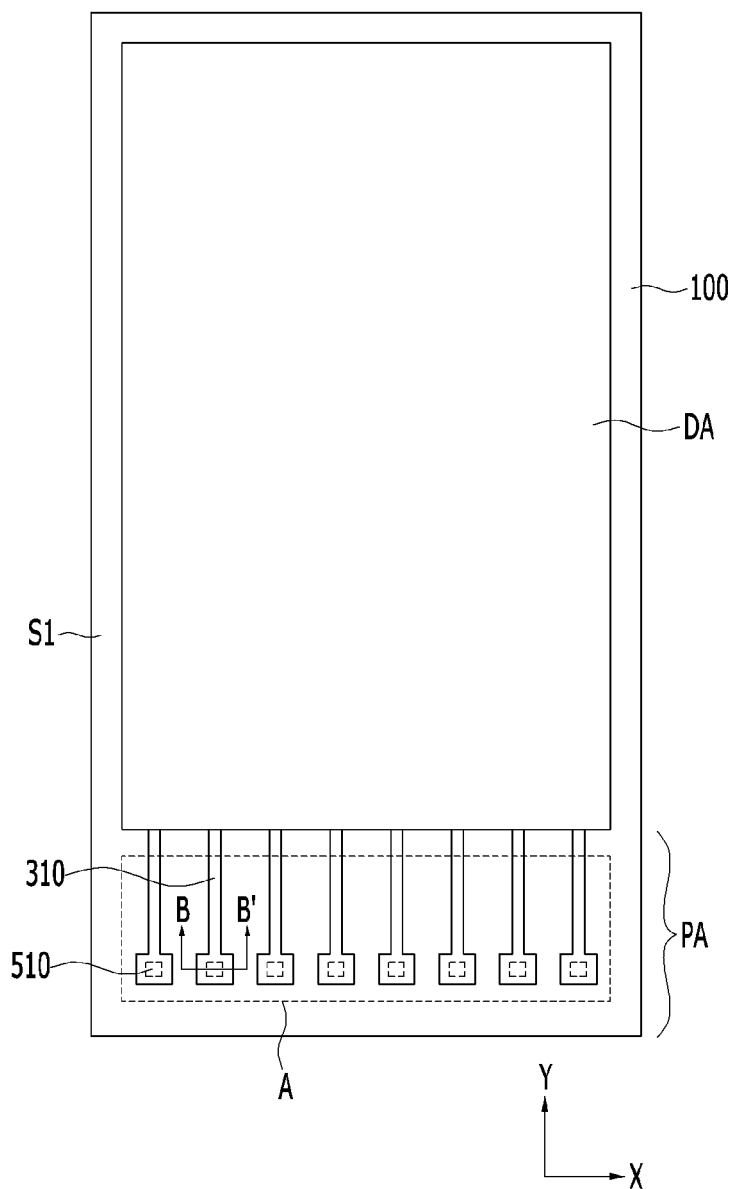
FIG. 6 is a schematic top plan view of a display device according to an exemplary embodiment of the invention.
Figure 7:
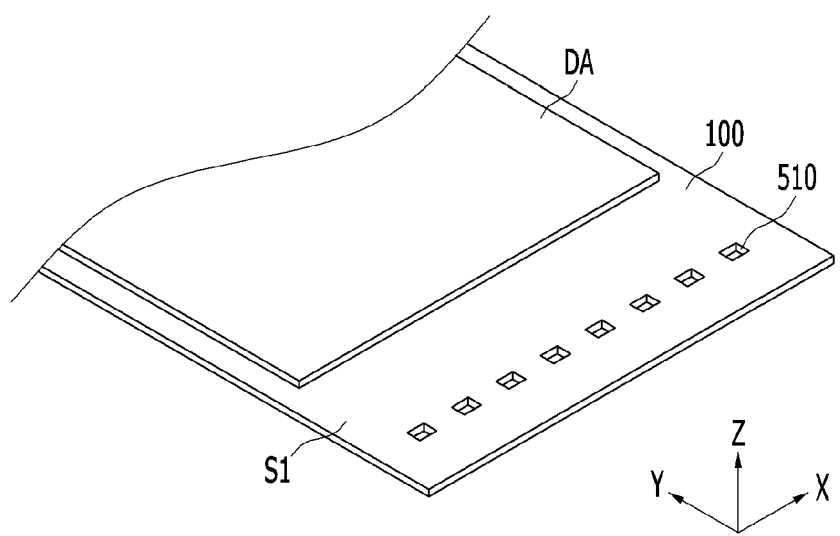
FIG. 7 is a partial view schematically showing a substrate including a plurality of through-holes.
Figure 8:
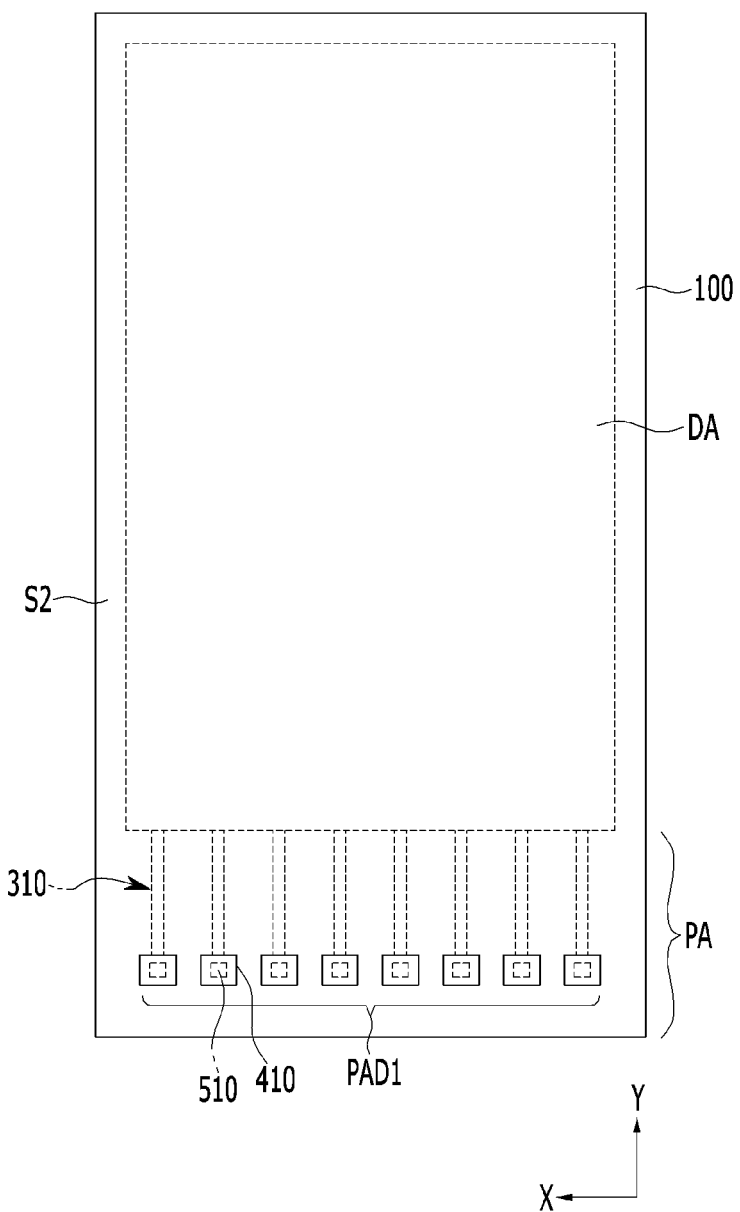
FIG. 8 is a schematic bottom view of a display device according to an exemplary embodiment of the invention.
Figure 9:
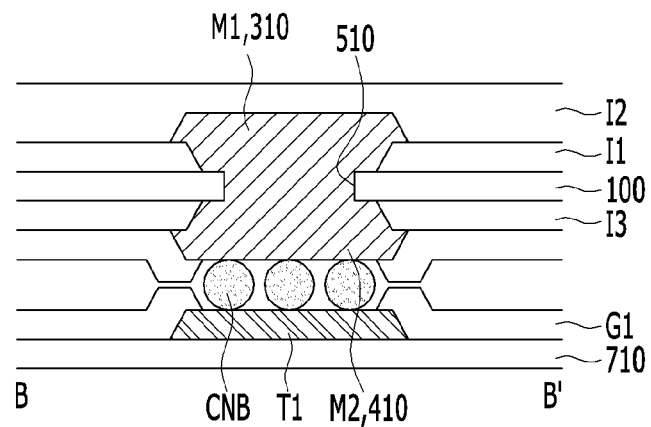
FIG. 9 is a cross-sectional view taken along line B-B' of FIG. 6.
Figure 10:
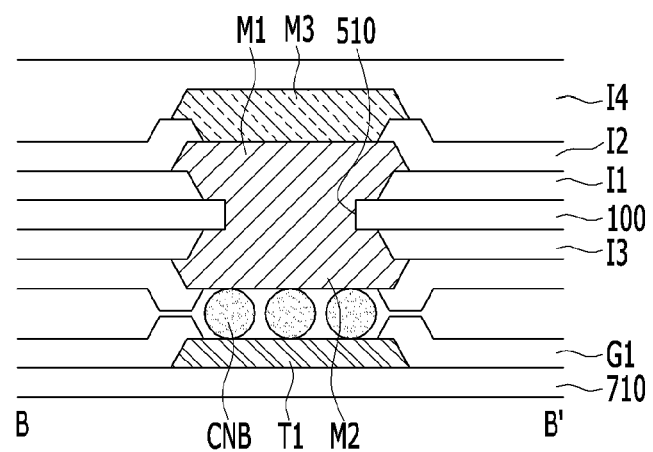
FIG. 10 is a cross-sectional view of a portion of an alternative exemplary embodiment corresponding to FIG. 9.

FIG. 6 is a schematic top plan view of a display device according to an exemplary embodiment of the invention, and FIG. 7 is a partial view schematically showing a substrate including a plurality of through-holes. FIG. 8 is a schematic bottom view of a display device according to an exemplary embodiment of the invention, FIG. 9 is a cross-sectional view taken along line B-B' of FIG. 6, and FIG. 10 is a cross-sectional view of a portion of an alternative exemplary embodiment corresponding to FIG. 9.

Referring to FIG. 6 to FIG. 8, in an exemplary embodiment, a plurality of connection wires 310 may be disposed on the first surface S1 of the substrate 100. The plurality of connection wires 310 may be disposed on the first surface S1 of the substrate 100 as the display area DA. In such an embodiment, the plurality of connection wires 310 and the display area DA may be disposed on the first surface S1 or the upper surface of the substrate 100. In such an embodiment, the plurality of connection wires 310 may be disposed on the peripheral area PA positioned around the display area DA.

In such an embodiment, the plurality of connection wires 310 respectively extend to be parallel to the second direction (a Y-axis). In such an embodiment, the plurality of connection wires 310 may have a linear shape or a straight line shape while extending along the second direction (the Y-axis) without a curved portion. In FIG. 6, the plurality of connection wires 310 are shown as several for convenience of description, but several tens or hundreds of connection wires 310 may be arranged.

In an exemplary embodiment, as described above, a plurality of connection wires 310 are connected to a plurality of signal lines (not shown) disposed in the display area DA, thereby the signals transmitted from the printed circuit board 700 may be transmitted to the plurality of signal lines of the display area DA. Accordingly, the plurality of connection wires 310 may serve to electrically connect the display area DA and the printed circuit board 700.

In an exemplary embodiment, a plurality of through-holes 510 may be defined through the substrate 100 in the peripheral area PA of the substrate 100. FIG. 7 is a view of the peripheral area PA in which the plurality of connection wires 310 is omitted, for convenience of illustration, and shows that both ends of the plurality of through-holes 510 may be respectively defined from the first surface S1 to the second surface S2 through the substrate 100. In such an embodiment, the plurality of through-holes 510 may extend along a third direction (a Z-axis) perpendicular to the surface direction of the first surface S1 and the second surface S2.

The plurality of through-holes 510, for example, may be defined to be spaced apart or separated from each other in the first direction (the X-axis). In an exemplary embodiment, the plurality of through-holes 510 may be disposed to correspond to the plurality of connection wires 310. In such an embodiment, the number of the plurality of through-holes 510 may be the same as the number of the plurality of connection wires 310. In such an embodiment, each of the plurality of connection wires 310 may be disposed to overlap a corresponding one among the plurality of through-holes 510. In FIG. 6, several through-holes 510 are shown as several for convenience of description, but several tens or hundreds of through-hole 510 may be arranged as the connection wires 310.

In an exemplary embodiment, the first pad portion PAD1 (referring to FIG. 2) may be disposed on the second surface S2 of the substrate 100. In such an embodiment, the first pad portion PAD1 (referring to FIG. 2) may include a plurality of first pad terminals 410.

Referring to FIG. 8, the plurality of first pad terminals 410 may be disposed along the first direction (the X-axis). The plurality of first pad terminals 410 may be disposed to be spaced apart or separated from each other along the first direction (the X-axis). The plurality of first pad terminals 410 may be disposed to correspond to the plurality of through-holes 510. In an exemplary embodiment, the number of the plurality of first pad terminals 410 may be the same as the number of the plurality of through-holes 510, and each of the plurality of first pad terminals 410 may be disposed to overlap a corresponding one among the plurality of through-holes 510.

Accordingly, in an exemplary embodiment, the connection wires 310, the through-holes 510 and the first pad terminal 410 may be respectively disposed to correspond to each other. In such an embodiment, one among the plurality of connection wires 310, one among the plurality of through-holes 510 and one among the plurality of first pad terminals 410 may correspond to each other.

Referring to FIG. 6 and FIG. 9, through the plurality of through-holes 510, the plurality of connection wires 310 and the plurality of first pad terminals 410 may be electrically connected to each other. The plurality of first pad terminals 410 may have a quadrangular plate-like shape. However, the shape of the first pad terminal 410 is not limited thereto, and it may be formed as a polygon, a circle, an oval, and the like. In an exemplary embodiment, a conductive material may be filled in the plurality of through-holes 510. In an exemplary embodiment, the conductive material positioned in the plurality of through-hole 510 may include or be made of the same material as the plurality of connection wires 310. In such an embodiment, the plurality of first pad terminals 410 may include or be made of the same conductive material as the plurality of connection wires 310. In such an embodiment, the conductive material filled in the plurality of through-holes 510 may define the plurality of connection wires 310 and the plurality of first pad terminals 410.

In an exemplary embodiment, as shown in FIG. 9, a first metal member M1 disposed on the through-hole 510 may be a metal layer that defines the connection wires 310, and a second metal member M2 disposed under the through-hole 510 may be a metal layer that defines the first pad terminal 410.

In an exemplary embodiment, a third metal member T1 of the printed circuit board 700 in contact with the first pad terminal 410 may define the second pad terminal 750. In such an embodiment, a plurality of conductive balls CNB may be disposed between the first pad terminal 410 and the second pad terminal 750, thereby the pad terminal 410 and the second pad terminal 750 may be electrically connected to each other through the plurality of conductive balls CNB.

In such an embodiment, as shown in FIG. 9, the conductive material positioned in the through-hole 510 and the connection wires M1 and 310 and the first pad terminals M2 and 410 may include or be made of a same conductive material. In such an embodiment, the inside of the through-hole 510, and the connection wires M1 and 310 and the first pad terminals M2 and 410, may be integrally formed as a single unitary and indivisible unit. In an exemplary embodiment, the connection wires 310 may be disposed in a same layer as the gate line disposed in the display area DA. In an exemplary embodiment, where the gate lines of the display area are defined by a single layer provided on the substrate 100, the connection wires 310 may be defined by a same layer as the gate line. In such an embodiment, the connection wires 310 may be made of a portion of the single layer corresponding to the first metal member M1.

In an exemplary embodiment, the connection wires 310 positioned on the through-hole 510 may be covered by the insulating layer 12. In FIG. 9, reference numerals I1, I3 and G1 refers insulating layers, and may be selectively omitted.

However, the invention is not limited thereto. In an exemplary embodiment, where the gate lines disposed in the display area DA are defined by a dual layer, the connection wires 310 may be defined by the dual layer. In an exemplary embodiment, as shown in FIG. 10, the connection wires 310 may include a portion of a layer that defines the first gate wire GW1 (referring to FIG. 5) and a portion of a layer that defines the second gate wire GW2 (referring to FIG. 5). In such an embodiment, the connection wires 310 may include a first metal member M1 corresponding to the first gate wire GW1 (referring to FIG. 5) and a fourth metal member M3 corresponding to the second gate wire GW2 (referring to FIG. 5).

In an exemplary embodiment, the connection wires 310 may be disposed in a same layer as the data line in the display area DA. In an exemplary embodiment, where the plurality of first pad terminals 410 is connected to the connection wires 310 through the plurality of through-holes 510, the plurality of first pad terminals 410 are allowed to be disposed on the second surface S2, not the first surface S1 of the substrate 100. Accordingly, in such an embodiment, the plurality of first pad terminals 410 in contact with the printed circuit board 700 may be disposed on the lower surface of the substrate 100, thereby being in direct contact with the second surface S2, not the first surface S1 of the substrate 100. Accordingly, the material cost may be reduced and the dead space of the display device may be reduced. Such features will be described in greater detail with reference to FIG. 11.

Figure 11:
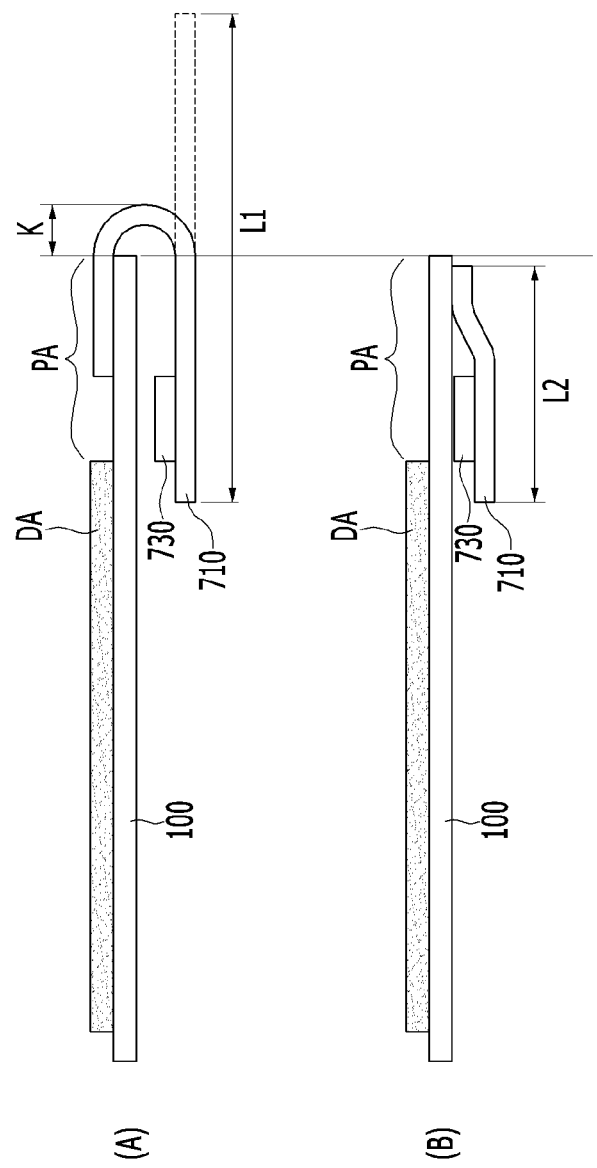
FIG. 11 is a view comparing a length of a printed circuit board of an exemplary embodiment and a comparative embodiment.

FIG. 11 is a view comparing a length of a printed circuit board of an exemplary embodiment and a comparative embodiment. More particularly, FIG. 11 (A) is a view of a display device according to a comparative embodiment in which the printed circuit board 700 is in contact with the upper surface of the substrate 100, and FIG. 11 (B) is a view of a display device according to an exemplary embodiment in which the printed circuit board 700 is in contract with the lower surface of the substrate 100.

Referring to FIG. 11 (A), in the comparative embodiment, a part of the printed circuit board 700 is in contact with the upper surface of the substrate 100, another part of the printed circuit board 700 may be bent and the remaining part of the printed circuit board 700 may be disposed on the lower surface of the substrate 100. In an exemplary embodiment, referring to FIG. 11 (B), the printed circuit board 700 is in contact with the lower surface of the substrate 100, and the printed circuit board 700 may be disposed on the lower surface of the substrate 100 without any bending.

In FIG. 11 (A), the entire length of the printed circuit board 700 in the comparative embodiment is represented by a first length L1 when being flat, and the entire length of the printed circuit board 700 in an exemplary embodiment may be represented by a second length L2 in FIG. 11 (B). As shown in FIG. 11 (A) and FIG. 11 (B), the second length L2 is smaller than the first length L1 (L1<L2). That is, in an exemplary embodiment, where the printed circuit board 700 is in contact with the lower surface of the substrate 100 through the plurality of through-holes 510, the length of the printed circuit board 700 may be reduced. Accordingly, by reducing the length of the flexible base film 710, the manufacturing cost of the display device may be reduced.

Also, in FIG. 11 (A), as the part of the printed circuit board 700 is bent, the dead space corresponding to a width K of the bent printed circuit board 700 may occur. In an exemplary embodiment, as shown in FIG. 11 (B), the printed circuit board 700 is not bent such that the size of the peripheral area PA may be reduced by the width K shown in FIG. 11 (A). That is, in an exemplary embodiment, where the printed circuit board 700 is in contact with the lower surface of the substrate 100, the dead space of the display device may be reduced.

Next, alternative exemplary embodiments of a display device will be described with reference to FIG. 12 to FIG. 17. The same or like elements shown in FIG. 12 to FIG. 17 have been labeled with the same reference characters as used above to describe the exemplary embodiments of the display device described above, and any repetitive detailed description thereof will hereinafter be omitted or simplified.

Figure 12:
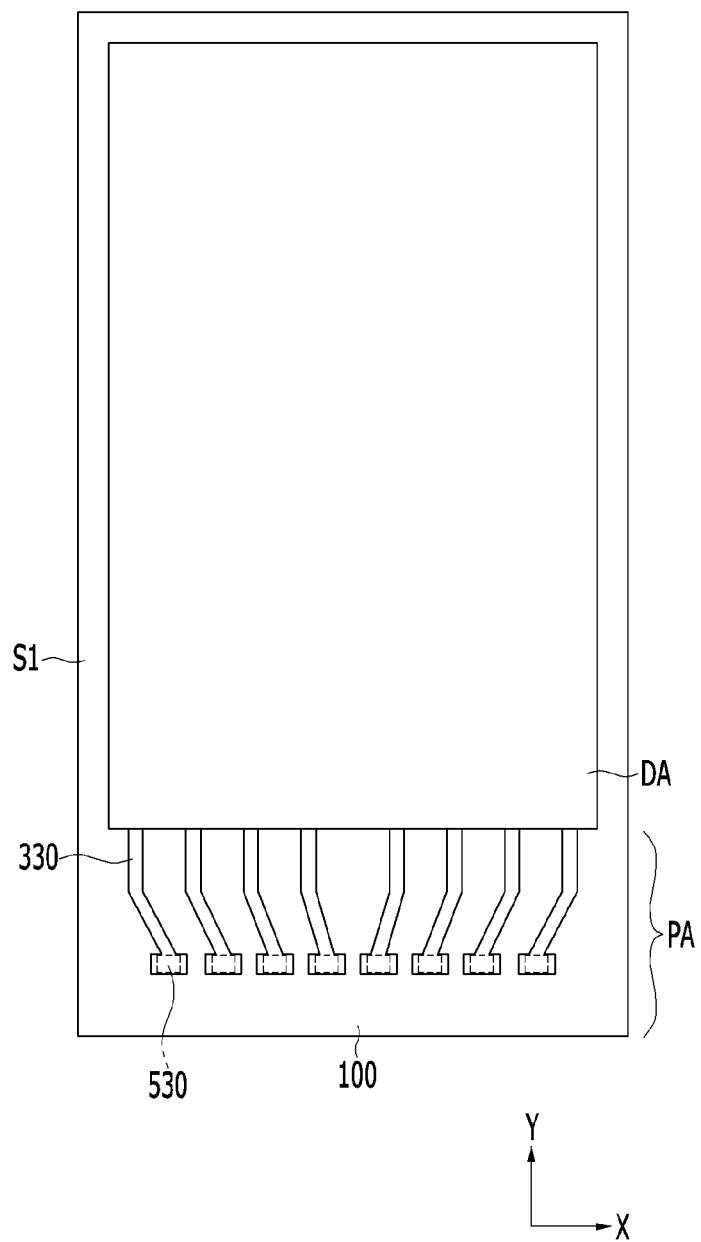
FIG. 12 is a view of an alternative exemplary embodiment of a display device of FIG. 6.
Figure 13:
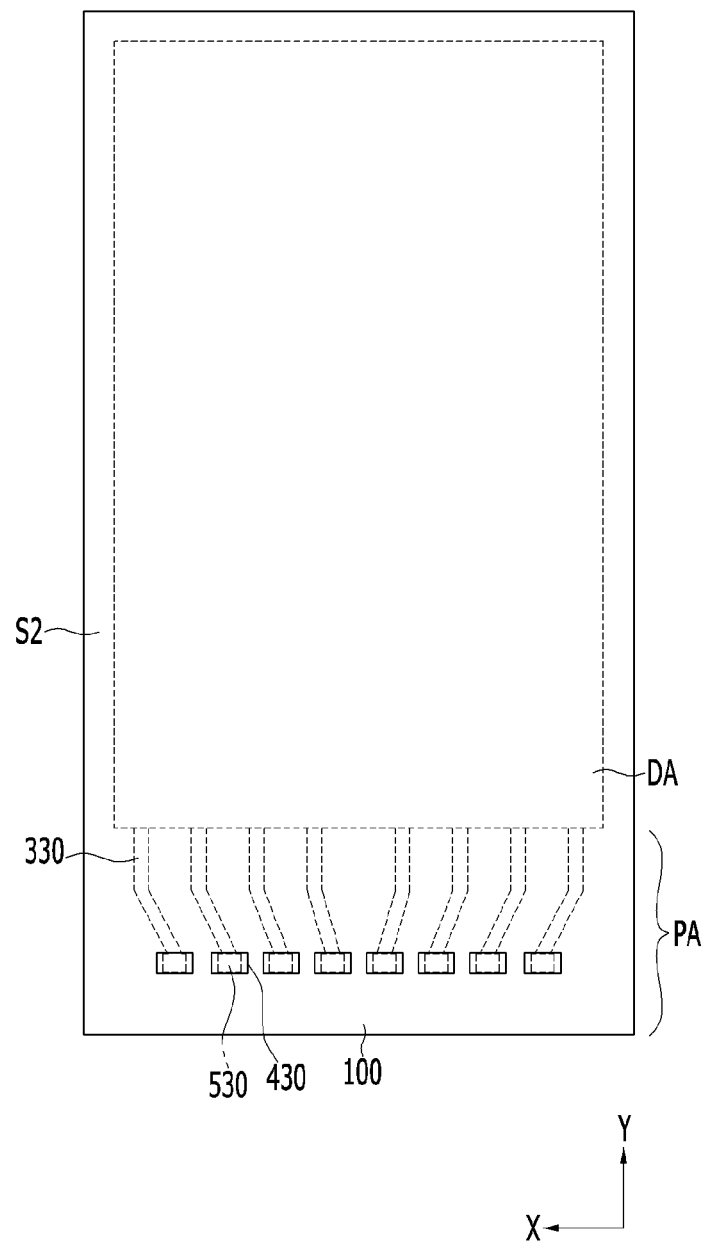
FIG. 13 is a schematic bottom view of a display device of FIG. 12.
Figure 14:
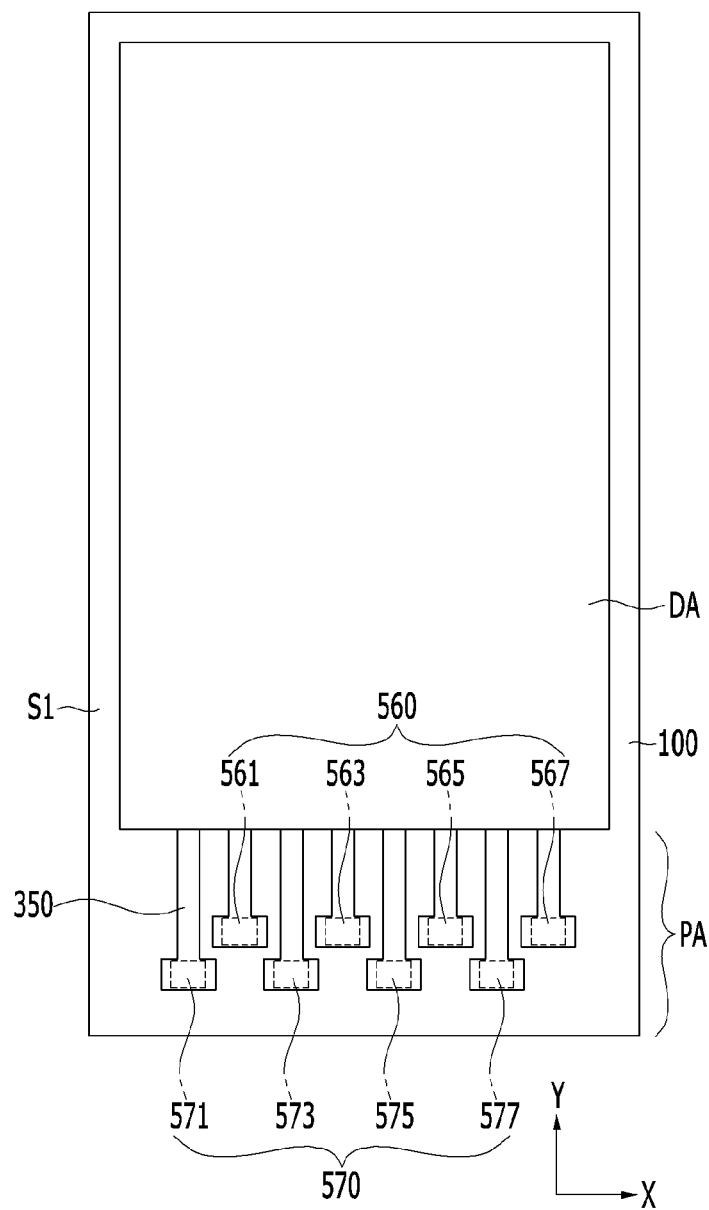
FIG. 14 is a view of another alternative exemplary embodiment of a display device of FIG. 6.
Figure 15:
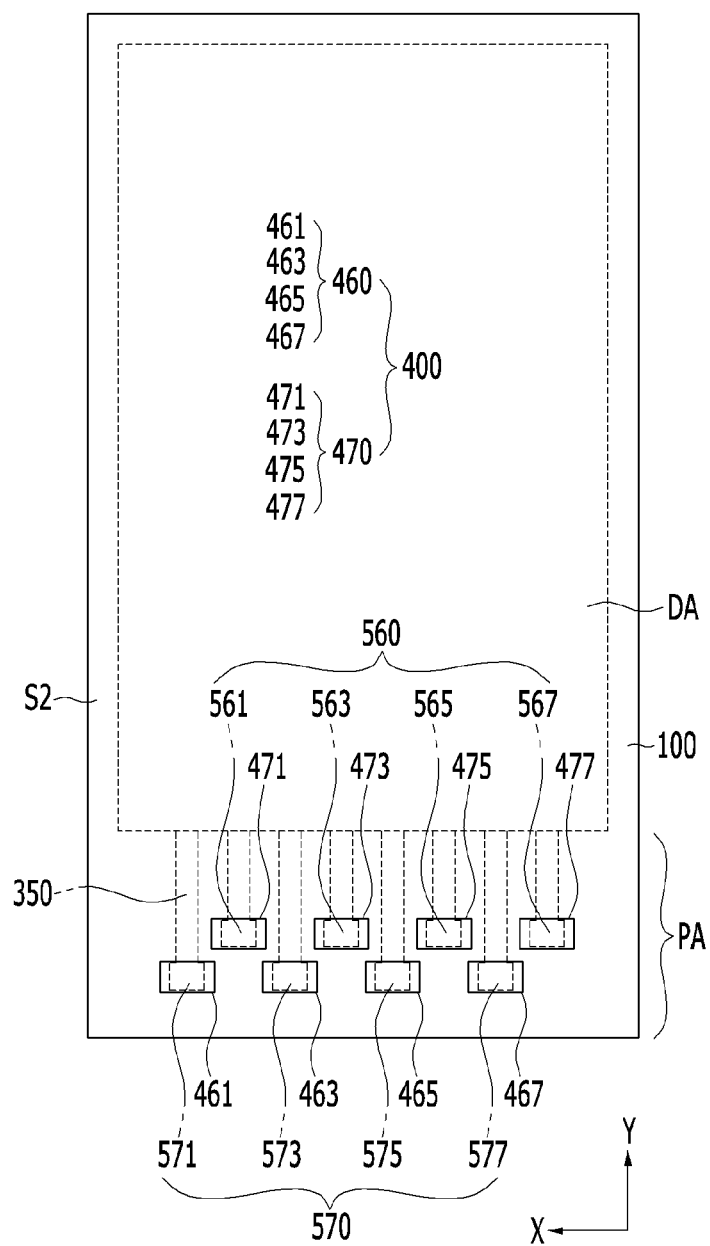
FIG. 15 is a schematic bottom view of a display device of FIG. 14.
Figure 16:
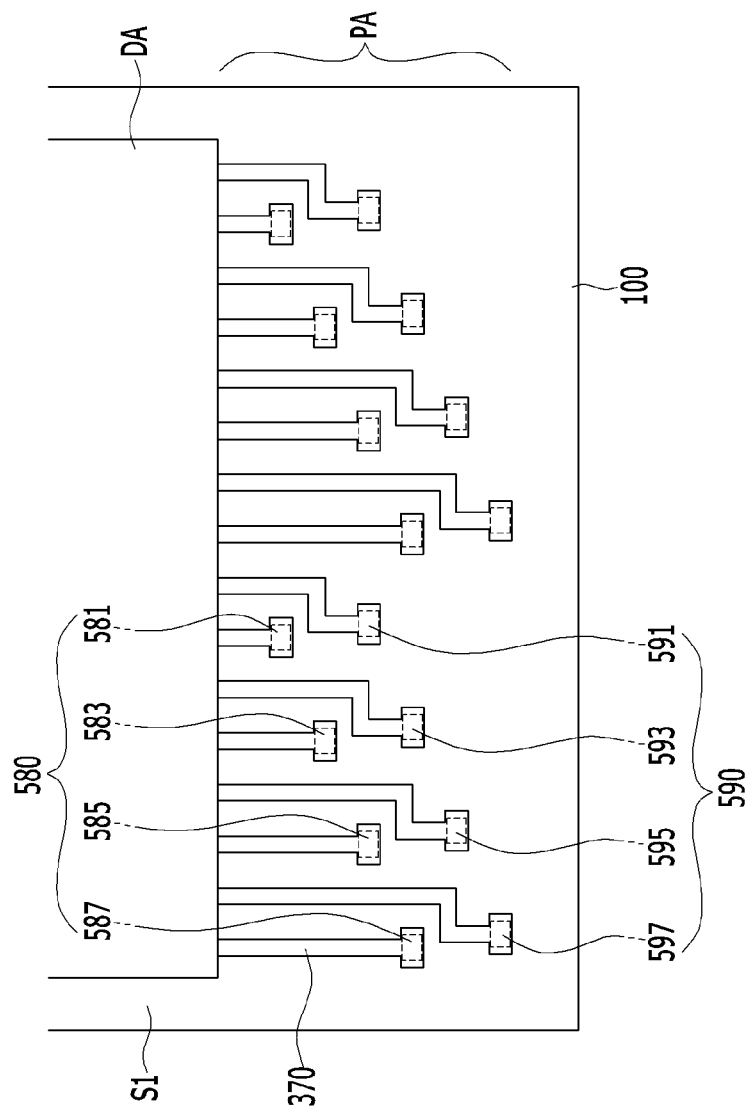
FIG. 16 is a view of another alternative exemplary embodiment of a display device of FIG. 6.
Figure 17:
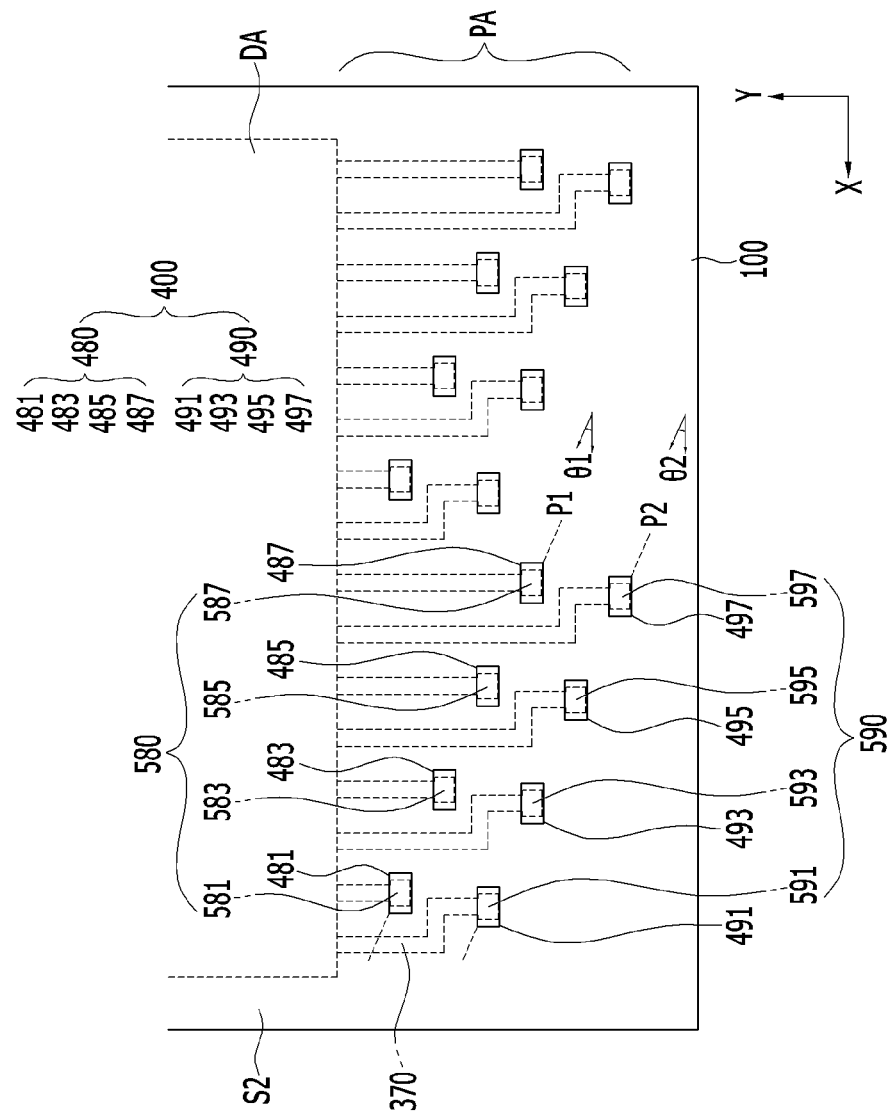
FIG. 17 is a schematic bottom view of a display device of FIG. 16.

FIG. 12 is a view of an alternative exemplary embodiment of a display device of FIG. 6, and FIG. 13 is a schematic bottom view of a display device of FIG. 12. FIG. 14 is a view of another alternative exemplary embodiment of a display device of FIG. 6, and FIG. 15 is a schematic bottom view of a display device of FIG. 14. FIG. 16 is a view of another alternative exemplary embodiment of a display device of FIG. 6, and FIG. 17 is a schematic bottom view of a display device of FIG. 16.

Referring to FIG. 12 and FIG. 13, in an exemplary embodiment, a plurality of connection wires 330 may have a shape that is bent at least one time. In an exemplary embodiment, as shown in FIG. 6, the plurality of connection wires 310 extend along the second direction (the Y-axis) to have the straight shape without being bent. In an alternative exemplary embodiment, as shown in FIG. 12, the plurality of connection wires 330 may have the shape that is bent one time or more, while extending in the second direction (the Y-axis).

The plurality of connection wires 330 extend along the second direction (the Y-axis) and are then bent, thereby the ends of the plurality of connection wires 330 may be disposed to be close to each other. In such an embodiment, a plurality of through-holes 530 disposed to overlap the plurality of connection wires 330 may be more closely arranged than the plurality of through-holes 510 shown in FIG. 6. In such an embodiment, first pad terminals 430 overlapping the plurality of through-holes 530 are arranged to be close, and accordingly, the second pad terminals disposed in the second pad portion PAD2 of the printed circuit board 700 may be arranged to be close.

According to an exemplary embodiment, the second pad terminals are arranged to be close, such that the width of the printed circuit board 700 may be reduced. Here, the width of printed circuit board 700 may represent the size of the printed circuit board 700 measured along the first direction (the X-axis). In such an embodiment, as described above, the width of the printed circuit board 700 is reduced, such that the manufactured cost of the display device may be reduced.

Referring to FIG. 14 and FIG. 15, in another alternative exemplary embodiment, a plurality of through-holes 560 and 570 may include first row through-holes 560 and second row through-holes 570. The first row through-holes 560 may be linearly arranged along a first row (not shown) parallel to the first direction (the X-axis). The second row through-hole 570 may be linearly arranged to along a second row (not shown) parallel to the first direction (the X-axis). The first row (not shown) and the second row (not shown) may be parallel to each other, but not being limited thereto. Alternatively, the first row through-holes 560 and the second row through-hole 570 may be spaced apart or separated from each other along the second direction (the Y-axis).

In an exemplary embodiment, a length of a plurality of connection wires 350 in at least two second directions (the Y-axis) may be different from each other. In one exemplary embodiment, for example, as shown in FIG. 14, the length of the plurality of connection wires 350 overlapping the first row through-hole 560 may be smaller than the length of the plurality of connection wires 350 overlapping the second row through-hole 570.

A first pad terminal 400 disposed on the second surface S2 of the substrate 100 may include first connection pad terminals 470 and second connection pad terminals 460. The first connection pad terminal 470 may be linearly arranged along the first row (not shown). The first connection pad terminals 470 may overlap the first row through-holes 560, respectively. In one exemplary embodiment, for example, a first connection pad terminal 471 may be disposed to overlap a first row through-hole 561, and a first connection pad terminal 473 may be disposed to overlap a first row through-hole 563. In such an embodiment, a first connection pad terminal 475 may be disposed to overlap a first row through-hole 565, and a first connection pad terminal 477 may be disposed to overlap a first row through-hole 567.

The second connection pad terminals 460 may be linearly arranged along the second row (not shown). The second connection pad terminals 460 may overlap the second row through-holes 570, respectively. In one exemplary embodiment, for example, a second connection pad terminal 461 may be disposed to overlap a second row through-hole 571, and a second connection pad terminal 463 may be disposed to overlap a second row through-hole 573. In such an embodiment, a second connection pad terminal 465 may be disposed to overlap a second row through-hole 575, and a second connection pad terminal 467 may be disposed to overlap a second row through-hole 577.

In an exemplary embodiment, the second pad terminal (not shown) of the printed circuit board 700 may be arranged with a shape corresponding to the first pad terminal 400 of the substrate 100.

Referring to FIG. 16 and FIG. 17, in another alternative exemplary embodiment, the plurality of through-holes 580 and 590 may include third row through-holes 580 and fourth row through-holes 590. The third row through-holes 580 may be disposed to be spaced apart or separated from each other along a third row P1 that forms a first inclination angle $\theta 1$ with the first direction (the X-axis). In such an embodiment, the third row through-holes 580 may be linearly arranged to be inclined by the first inclination angle $\theta 1$ with the first direction (the X-axis). In such an embodiment, the first inclination angle $\theta 1$ may be larger than about zero (0) degree to less than about 90 degrees.

The fourth row through-holes 590 may be disposed to be spaced apart or separated from each other along a fourth row P2 that forms a second inclination angle $\theta 2$ with the first direction (the X-axis). In such an embodiment, the fourth row P2 may be spaced apart or separated from the third row P1. The fourth row through-holes 590 may be linearly arranged to be inclined in the second inclination angle $\theta 2$ with the first direction (the X-axis). In such an embodiment, the second inclination angle $\theta 2$ may be larger than about zero (0) degree to less than about 90 degrees.

In an exemplary embodiment, the first inclination angle $\theta 1$ and the second inclination angle $\theta 2$ may be equal to each other. Accordingly, the third row through-holes 580 and the fourth row through-holes 590 may be linearly arranged to be inclined at the same angle with the first direction (the X-axis). However, the invention is not limited thereto. Alternatively, the first inclination angle $\theta 1$ and the second inclination angle $\theta 2$ may be different from each other. In such an embodiment, the third row through-holes 580 and the fourth row through-holes 590 are arranged to be inclined at different angles with the first direction (the X-axis).

The first pad terminals 400 disposed on the second surface S2 of the substrate 100 may include third connection pad terminals 480 and fourth connection pad terminals 490. The third connection pad terminals 480 may be linearly arranged along the third row P1. The third connection pad terminals 480 may overlap the third row through-holes 580, respectively. In one exemplary embodiment, for example, a third connection pad terminal 481 may be disposed to overlap a third row through-hole 581, and a third connection pad terminal 483 may be disposed to overlap a third row through-hole 583. In an exemplary embodiment, a third connection pad terminal 485 may be disposed to overlap a third row through-hole 585, and a third connection pad terminal 487 may be disposed to overlap a third row through-hole 587.

The second connection pad terminals 460 may be linearly arranged along the fourth row P2. The fourth connection pad terminals 490 may overlap the fourth row through-holes 590, respectively. In one exemplary embodiment, for example, a fourth connection pad terminal 491 may be disposed to overlap a fourth row through-hole 591, and a fourth connection pad terminal 493 may be disposed to overlap a fourth row through-hole 593. In such an embodiment, a fourth connection pad terminal 495 may be disposed to overlap a fourth row through-hole 595, and a fourth connection pad terminal 497 may be disposed to overlap a fourth row through-hole 597.

In an exemplary embodiment, the second pad terminal (not shown) of the printed circuit board 700 may also be arranged with a shape corresponding to the first pad terminal 400 of the substrate 100.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
 a substrate including:
  a display area defined on a first surface thereof and which displays an image;
  a peripheral area defined around the display area, wherein a plurality of through-holes is defined through the substrate in the peripheral area;
 a first pad portion disposed on a second surface of the substrate, which is opposite to the first surface of the substrate;
 a plurality of connection wires disposed on the peripheral area, wherein the plurality of connection wires connects the display area and the first pad portion through the plurality of through-holes;
 a printed circuit board including a second pad portion connected to the first pad portion; and
 a plurality of gate lines in the display area on the substrate, wherein inside the through-holes, the plurality of connection wires and corresponding first pad portions are integrally formed as a single unitary and indivisible unit, and further comprising: a plurality of data lines in the display area on the substrate; and
 a plurality of gate lines in the display area on the substrate and crossing the plurality of data lines, wherein the plurality of connection wires is disposed in a same layer as one of the plurality of data lines and the plurality of gate lines, wherein each of the plurality of gate lines has a dual-layer structure including a first gate member and a second gate member disposed on the first gate member, and the plurality of connection wires is disposed in a same layer as one of the first gate member and the second gate member.

2. The display device of claim 1, wherein
 the first pad portion includes a plurality of first pad terminals overlapping the plurality of through-holes.

3. The display device of claim 2, wherein
 the plurality of through-holes is linearly arranged in a first direction which is parallel to a boundary between the display area and the peripheral area where the plurality of through-holes are disposed.

4. The display device of claim 3, wherein
 the plurality of connection wires extends in a second direction crossing the first direction.

5. The display device of claim 4, wherein
 each of the plurality of connection wires is bent at least once.

6. The display device of claim 2, wherein the plurality of through-holes includes:
 a plurality of first row through-holes linearly arranged along a first row, which is parallel to a first direction which is parallel to a boundary between the display area and the peripheral area where the plurality of through-holes are disposed; and
 a plurality of second row through-holes linearly arranged along a second row, which is parallel to the first row, wherein the first row and the second row are spaced apart from each other in a second direction crossing the first direction.

7. The display device of claim 6, wherein the plurality of first pad terminals includes:
 a plurality of first connection pad terminals linearly arranged along the first row and overlapping the plurality of first row through-holes, respectively; and
 a plurality of second connection pad terminals linearly arranged along the second row and overlapping the plurality of second row through-holes, respectively.

8. The display device of claim 2, wherein the plurality of through-holes includes:
 a plurality of third row through-holes linearly arranged along a third row, wherein the third row forms a first inclination angle with a first direction which is parallel to a boundary between the display area and the peripheral area where the plurality of through-holes are disposed; and
 a plurality of fourth row through-holes linearly arranged along a fourth row, wherein the fourth row forms a second inclination angle with the first direction.

9. The display device of claim 8, wherein the plurality of first pad terminals includes:
 a plurality of third connection pad terminals linearly arranged along the third row and respectively overlapping the plurality of third row through-holes, respectively; and
 a plurality of fourth connection pad terminals linearly arranged along the fourth row and overlapping the plurality of fourth row through-holes, respectively.

10. The display device of claim 8, wherein
 the first inclination angle and the second inclination angle are equal to each other.

11. The display device of claim 10, wherein
 the first inclination angle and the second inclination angle are in a range of about zero degree to about 90 degrees.

12. The display device of claim 2, wherein
 the second pad portion includes a plurality of second pad terminals disposed in an arrangement corresponding to an arrangement of the plurality of first pad terminals.

13. The display device of claim 12, wherein the printed circuit board includes:
 a base film on which the second pad portion is disposed in a side thereof; and
 a driving chip disposed on the base film in an opposing side thereof.

14. The display device of claim 13, wherein the base film is flexible.

15. The display device of claim 2, wherein each of the plurality of first pad terminals has a quadrangular plate-like shape.

16. The display device of claim 1, wherein the substrate is flexible.

17. The display device of claim 1, wherein the first pad portion and the second pad portion face each other.

* * * * *